(12) United States Patent
Shiraishi

(10) Patent No.: US 8,017,443 B2
(45) Date of Patent: Sep. 13, 2011

(54) LIGHT TRANSMISSIVE COVER, DEVICE PROVIDED WITH SAME AND METHODS FOR MANUFACTURING THEM

(75) Inventor: Akinori Shiraishi, Nagano (JP)

(73) Assignee: Shinko Electric Industries Co., Ltd, Nagano (JP)

( * ) Notice: Subject to any disclaimer, the term of this patent is extended or adjusted under 35 U.S.C. 154(b) by 652 days.

(21) Appl. No.: 11/324,720

(22) Filed: Jan. 3, 2006

(65) Prior Publication Data
US 2006/0113649 A1 Jun. 1, 2006

Related U.S. Application Data

(62) Division of application No. 10/970,342, filed on Oct. 21, 2004, now Pat. No. 7,274,096.

(30) Foreign Application Priority Data

Oct. 22, 2003 (JP) .................................. 2003-362080

(51) Int. Cl.
*H01L 23/02* (2006.01)

(52) U.S. Cl. ............ 438/116; 438/26; 438/28; 438/107; 438/110; 438/113; 438/118

(58) Field of Classification Search .................. 257/434, 257/704, 794; 438/69, 22, 26, 29, 33, 48, 438/28, 107, 110, 113, 116, 118
See application file for complete search history.

(56) References Cited

U.S. PATENT DOCUMENTS

| | | |
|---|---|---|
| 4,005,457 A | 1/1977 | Hill et al. |
| 4,760,440 A | 7/1988 | Bigler et al. |
| 4,929,965 A | 5/1990 | Fuse |
| 4,949,152 A | 8/1990 | Asano et al. |
| 5,005,029 A | 4/1991 | Fuse |
| 5,357,056 A | 10/1994 | Nagano |
| 5,534,725 A | 7/1996 | Hur |
| 5,739,800 A | 4/1998 | Lebby et al. |
| 5,773,323 A | 6/1998 | Hur |
| 5,867,368 A | 2/1999 | Glenn |
| 6,075,237 A | 6/2000 | Ciccarelli |
| 6,130,448 A | 10/2000 | Bauer et al. |
| 6,144,435 A | 11/2000 | Yokoyama et al. |
| 6,147,389 A | 11/2000 | Stern et al. |
| 6,342,406 B1 | 1/2002 | Glenn et al. |
| 6,492,699 B1 | 12/2002 | Glenn et al. |
| 6,525,944 B1 | 2/2003 | Li |

(Continued)

FOREIGN PATENT DOCUMENTS

JP 2000-323614 A 11/2000

(Continued)

*Primary Examiner* — Ha Tran T Nguyen
*Assistant Examiner* — Suberr Chi
(74) *Attorney, Agent, or Firm* — Walter G. Hanchuk; Chadbourne & Parke LLP

(57) ABSTRACT

A light transmissive cover for a device comprising: a cover member of light transmissive material; and a junction member joined to the cover member, the junction member being a member used to be joined to the body of the device and having a light interrupting film on the inner surface thereof. A device provided with a light transmissive cover, the device being provided with a cover member of light transmissive material joined to the body of device via a junction member so as to cover at least a part of the device, and having a light interrupting film on the inner surface of the junction member is also disclosed. In addition, methods for manufacturing them disclosed.

5 Claims, 5 Drawing Sheets

U.S. PATENT DOCUMENTS

| | | |
|---|---|---|
| 6,538,312 B1 | 3/2003 | Peterson et al. |
| 6,605,828 B1 | 8/2003 | Schwarzrock et al. |
| 6,627,872 B1 | 9/2003 | FuKamura et al. |
| 6,787,869 B1 | 9/2004 | Vittu |
| 6,874,910 B2 | 4/2005 | Sugimoto et al. |
| 7,074,638 B2 * | 7/2006 | Maeda et al. .................. 438/75 |
| 2002/0113296 A1 * | 8/2002 | Cho et al. ..................... 257/659 |
| 2004/0133092 A1 | 7/2004 | Kain |
| 2005/0067681 A1 | 3/2005 | De Villeneuve et al. |

FOREIGN PATENT DOCUMENTS

| | | |
|---|---|---|
| JP | 2002-43463 | 2/2002 |
| JP | 2002-231921 A | 8/2002 |
| JP | 2002-246489 | 8/2002 |

\* cited by examiner

NON-PRIOR ART

NON-PRIOR ART

LIGHT TRANSMISSIVE COVER, DEVICE PROVIDED WITH SAME AND METHODS FOR MANUFACTURING THEM

This is divisional of application Ser. No. 10/970,342, filed Oct. 21, 2004, now U.S. Pat. No. 7,274,096 which claims priority to Japanese application no. 2003-362080 filed Oct. 22, 2003, is herein incorporated by reference.

BACKGROUND OF THE INVENTION

1. Field of the Invention

The present invention relates to a semiconductor device provided with a light transmissive cover.

2. Description of Prior Art

In a digital mirror device that utilizes a device having, on a silicon substrate, a plurality of micro-mirrors, capable of being driven mechanically, and an electronic circuit, for controlling the motion of the micro-mirrors and that projects an image by digitally controlling the motion of the micro-mirrors so as to reflect light from a light source, a light transmissive cover is attached to the device.

As shown in FIG. 5, a conventional digital mirror device 100 provided with a light transmissive cover is manufactured by positioning a separately fabricated light transmissive cover 106 to cover a device 104 mounted on a mounting substrate 102. The cover is composed of a case 110 formed of metallic material such as kovar (Fe—Ni—Co alloy with coefficient of thermal expansion similar to that of a glass material) and a glass sheet 112 fitted thereinto, and is provided inside with a light interrupting film 114 of $CrO_2$.

Such a cover is fabricated as follows. As shown in FIG. 6(a), a metal material such as kovar is mechanically processed, such as by machining, to form a case 110 having an opening 111. Then, as shown in FIG. 6(b), a glass material 112 is fitted into the opening 111 of the case 110. Subsequently, as shown in FIG. 6(c), the glass material 112 is ground to a thickness corresponding to that of the case. Then, after a $CrO_2$ film is formed on the inside of the case 110 by a process such as sputtering or evaporation, patterning is performed to form a light interrupting film 114, as shown in FIG. 6(d). The cover 106 thus fabricated is subsequently joined to a substrate having a device mounted thereon so as to cover the device to complete a device 100 provided with a light transmissive cover as shown in FIG. 5.

In the conventional device 100 provided with the light transmissive cover manufactured as described above, it was necessary that each case 110, for fixing the light transmissive glass member 112, and each cover glass 112, was processed separately. Therefore, the manufacture required not only much time and labor but also large cost. In addition, as the case 110 was fabricated by machining process, the cover became very large relative to the device 104 when it was assembled into a light transmissive cover 106. It was also disadvantageous that the product precision (quality) was not uniform.

As a prior art, for manufacturing a device provided with a cover, a method is described in JP 2002-43463 A in which a first semiconductor substrate having a semiconductor element formed thereon is joined to a second substrate (a lid substrate) comprising a glass or ceramic cover. In this case, the cover is fabricated by filling the recessed portion of the second substrate for cover with powder material such as glass or the like so as to become flat, and then also making the opposite side of the second substrate flat.

A method is described in JP 2002-246489 A in which, as a wafer level hermetic sealing method, a wafer having a semiconductor element formed thereon and a lid substrate having a lid for cover collectively formed thereon are separately fabricated, and a junction part consisting of solder is formed on the wafer or the lid wafer, and after the two wafers are joined by the junction part, the wafer is diced into chips.

SUMMARY OF THE INVENTION

It is an object of the present invention to resolve the problems described above, and to provide a device, provided with a light transmissive cover which is manufactured easily and which permits the assembled device to be reduced in size, and a method for manufacturing the device.

It is also an object of the present invention to provide a light transmissive cover used therefor and a method for manufacturing it.

A light transmissive cover for a device of the present invention is characterized in that it comprises a cover member of light transmissive material and a junction member connected thereto which is a member used to be joined to the body of the device and which has a light interrupting film on its inner surface.

A device provided with a light transmissive cover in accordance with the present invention is characterized in that it is provided with a cover member, of a light transmissive material, joined to the body of the device via a junction member so as to cover at least a part of the device, and has a light interrupting film on the inner surface of the junction member.

A light transmissive cover for a device in accordance with the present invention can be manufactured by a method comprising the steps of patterning a sheet of a junction member material, such as a silicon wafer, having a wafer-size or a larger size to form an opening in the region which covers the device, joining the junction member material sheet with a sheet of light transmissive material such as a glass sheet, and forming a light interrupting film on the inner surface of the opening of the junction member material sheet.

A device provided with a light transmissive cover in accordance with the present invention can be manufactured, after a light interrupting film has been formed according to the method as described above, by a method comprising the steps of joining the junction member material sheet to a wafer at prescribed position, the wafer having a semiconductor element formed thereon, and dicing the wafer having a semiconductor element formed thereon together with the light transmissive material sheet and the junction member material sheet into separate chips.

Alternatively, a light transmissive cover for a device in accordance with the present invention can be manufactured by a method comprising the steps of joining a junction member material sheet to a light transmissive material sheet, patterning the junction member material sheet to form an opening in a region which covers the device later and to form grooves for subsequent dicing, and forming a light interrupting film on the inner surface of the opening of the junction member material sheet.

A device provided with a light transmissive cover in accordance with the present invention can also be manufactured, after a light interrupting film has been formed according to the method as described above, by a method comprising the steps of joining the junction member material sheet to a prescribed position of the wafer having semiconductor element formed thereon, and dicing the wafer having semiconductor elements formed thereon, together with the light transmissive material sheet and the junction member material sheet, into separate chips.

When using light transmissive covers, irrespective of a method employed for manufacturing the covers, the respective covers having light interrupting films formed thereon may be diced into separate chips, and each diced chip may then be joined to the wafer having semiconductor element formed thereon, at the prescribed position or, on the contrary, chips each diced in advance and comprising an element may be joined to respective covers having been fabricated integrally before the dicing into chips, and the respective covers may then be diced into chips. Further, it is also possible to join a diced cover to a diced chip.

Thus, the present invention further includes following methods of manufacturing a device provided with a light transmissive cover:

A method of manufacturing a device provided with a light transmissive cover, the light transmissive cover being provided with a cover member of a light transmissive material joined to the body of the device via a junction member so as to cover at least a part of the device and having a light interrupting film on the inner surface of the junction member, said method comprising the steps of: patterning a junction member material sheet of wafer size or of a larger size to form openings in the regions destined to cover the devices, joining the junction member material sheet to a light transmissive material sheet, forming a light interrupting film on the inner surface of the opening of the junction member material sheet, cutting the joined light transmissive material sheet and junction member material sheet to form individual light transmissive covers each having one above-mentioned opening, joining each of the individual light transmissive covers to a prescribed position of a wafer having elements formed thereon, and dicing the wafer having the elements formed thereon into separate chips.

A method of manufacturing a device provided with a light transmissive cover, the light transmissive cover being provided with a cover member of a light transmissive material joined to the body of the device via a junction member so as to cover at least a part of the device and having a light interrupting film on the inner surface of the junction member, said method comprising the steps of: joining a junction member material sheet to a light transmissive material sheet, patterning the junction member material sheet to form openings in the regions destined to cover the devices later, forming a light interrupting film on the inner surface of the opening of the junction member material sheet, cutting the joined light transmissive material sheet and junction member material sheet to form individual light transmissive covers each having one above-mentioned opening, joining each of the individual light transmissive covers to a prescribed position of a wafer having elements formed thereon, and dicing the wafer having the elements formed thereon into separate chips.

A method of manufacturing a device provided with a light transmissive cover, the light transmissive cover being provided with a cover member of a light transmissive material joined to the body of the device via a junction member so as to cover at least a part of the device and having a light interrupting film on the inner surface of the junction member, said method comprising the steps of: patterning a junction member material sheet of wafer size or of a larger size to form openings in the regions destined to cover the devices later, joining the junction member material sheet to a light transmissive material sheet, forming a light interrupting film on the inner surface of the opening of the junction member material sheet, joining individual chips each having an element formed thereon to the sections of individual light transmissive covers of the junction member material sheet each having one above-mentioned opening, and obtaining, by dicing, separate chips each comprising the section of individual light transmissive cover having the device joined thereto.

A method of manufacturing a device provided with a light transmissive cover, the light transmissive cover being provided with a cover member of a light transmissive material joined to the body of the device via a junction member so as to cover at least a part of the device and having a light interrupting film on the inner surface of the junction member, said method comprising the steps of: joining a junction member material sheet to a light transmissive material sheet, patterning the junction member material sheet to form openings in the regions destined to cover the devices later, forming a light interrupting film on the inner surface of the opening of the junction member material sheet, joining individual chips each having an element formed thereon to the sections of individual light transmissive covers of the junction member material sheet having the light interrupting film formed each having one above-mentioned opening, and obtaining, by dicing, separate chips each comprising the section of individual light transmissive cover having the device joined thereto.

A method of manufacturing a device provided with a light transmissive cover, the light transmissive cover being provided with a cover member of a light transmissive material joined to the body of the device via a junction member so as to cover at least a part of the device and having a light interrupting film on the inner surface of the junction member, said method comprising the steps of: patterning a junction member material sheet of wafer size or of a larger size to form openings in the regions destined to cover the devices later, joining the junction member material sheet to a light transmissive material sheet, forming a light interrupting film on the inner surface of the opening of the junction member material sheet, cutting the joined light transmissive material sheet and junction member material sheet to form individual light transmissive covers each having one above-mentioned opening, and joining the individual light transmissive cover to an individual chip having an element formed thereon.

A method of manufacturing a device provided with a light transmissive cover, the light transmissive cover being provided with a cover member of a light transmissive material joined to the body of the device via a junction member so as to cover at least a part of the device and having a light interrupting film on the inner surface of the junction member, said method comprising the steps of: joining a junction member material sheet to a light transmissive material sheet, patterning the junction member material sheet to form openings in the regions destined to cover the devices later, forming a light interrupting film on the inner surface of the opening of the junction member material sheet, cutting the joined light transmissive material sheet and junction member material sheet to form individual light transmissive covers each having one above-mentioned opening, and joining the individual light transmissive cover to an individual chip having an element formed thereon.

In accordance with the present invention, light transmissive covers can be manufactured collectively using a wafer-sized material, or in some cases, a larger-sized material, so that manufacturing process may be simplified as compared to prior art methods wherein light transmissive covers are manufactured separately. Product precision (quality) of covers can be improved as the covers are manufactured collectively before being separated from each other.

In addition, integrating collectively manufactured light transmissive covers with a wafer having elements formed thereon for subsequent processing has an advantage that the need of forming grooves in a cover case for wiring extension from the device within the cover to a mounting substrate is eliminated. In general, when a brittle material such as silicon is used as a case member (junction member) for a cover, there is a problem that the case is liable to breakage during processing. When, however, a silicon wafer is used as a junction member material sheet according to the invention, it can be integrated with a material such as a glass sheet and be then processed, and it is possible to eliminate the problem. Moreover, in this case, when through-holes (openings) are to be formed in the junction member material sheet by etching or the like, the etching is stopped at the interface with the glass sheet, thereby permitting through-holes with good shapes to be formed.

DETAILED DESCRIPTION OF THE INVENTION

The present invention will now be described in detail with reference to drawings. It is to be understood that the present invention is by no means limited by the embodiments described below.

First, manufacture of a light transmissive cover according to an embodiment of the present invention and manufacture of a device with a light transmissive cover using the resultant cover will be described with reference to FIGS. 1A to 1F.

Figure 1A:
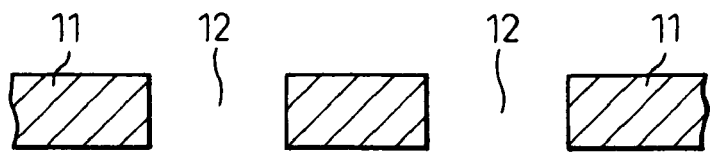
FIGS. 1A to 1F illustrate the manufacture of a light transmissive cover according to an embodiment of the present invention, and the manufacture of a device with a light transmissive cover using the resultant cover.
Figure 1B:
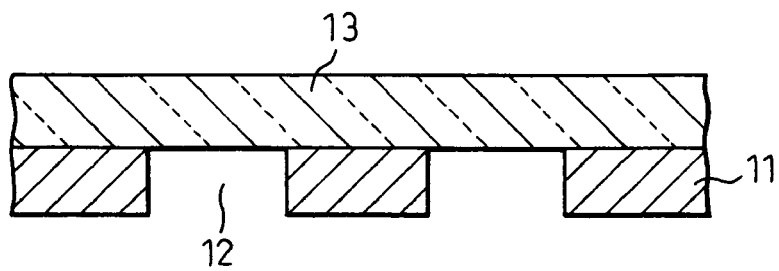

As shown in FIG. 1A, a silicon wafer 11 is patterned to form openings 12. The patterning may be performed by etching (for example, wet etching using an alkaline etching solution such as KOH or TMAH, or dry etching such as reactive ion etching (RIE)). The size of the opening 12 formed is determined by taking into consideration the size of the device to be joined to a cover. Then, as shown in FIG. 1B, the silicon wafer 11 is joined to a glass sheet 13 to be integrated therewith. The joining may be performed using methods such as anodic bonding or the like. An adhesive may also be used to perform the joining.

Figure 1C:
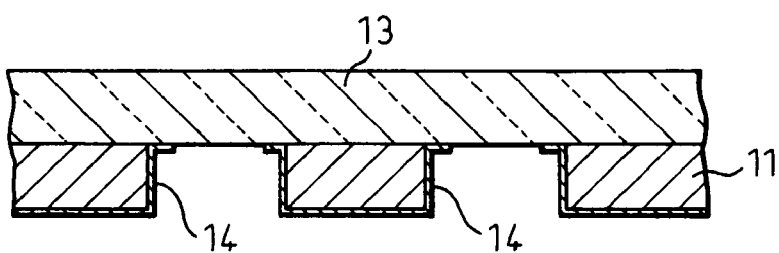

Next, as shown in FIG. 1C, a light interrupting film 14 is formed on the inner surface of the opening 12 of the silicon wafer 11. Alternatively, a light interrupting film 14 may be formed after the step of FIG. 1A, i.e., the formation of the openings 12 in the silicon wafer 11. The light interrupting film 14 may be formed by, for example, depositing a $CrO_2/Cr$ thin film by sputtering or evaporation and patterning the deposited film. Film thickness of the $CrO_2/Cr$ thin film formed may be generally of the order of 0.2 μm. The light interrupting film 14 may be formed by patterning it so as to cover a part of glass sheet surface in the region of the opening 12, as shown in the drawing.

Figure 1D:
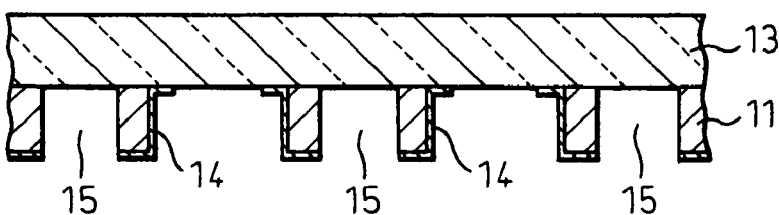
Figure 1E:
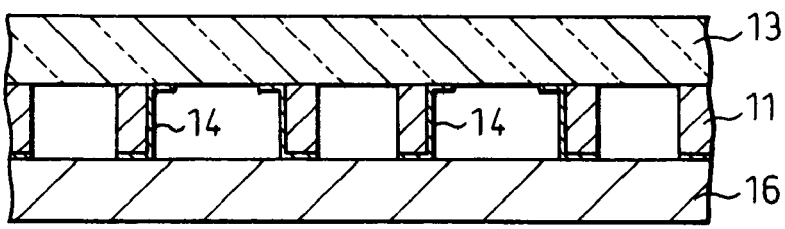

After the light interrupting film 14 has been formed, grooves 15 are formed by machining or the like in the silicon wafer 11 integrated with the glass sheet 13 for dicing to be performed later, as shown in FIG. 1D. Then, as shown in FIG. 1E, the wafer 11 having the grooves 15 formed therein is joined to a prescribed position of another wafer 16 having elements such as digital mirror devices (not shown) formed thereon. Ultrasonic bonding, for example, may be used to perform this joining. In some cases, it is possible to use an adhesive to join the silicon wafer 11 integrated with the glass sheet 13 to the wafer 16 having, in advance, elements formed thereon.

Figure 1F:
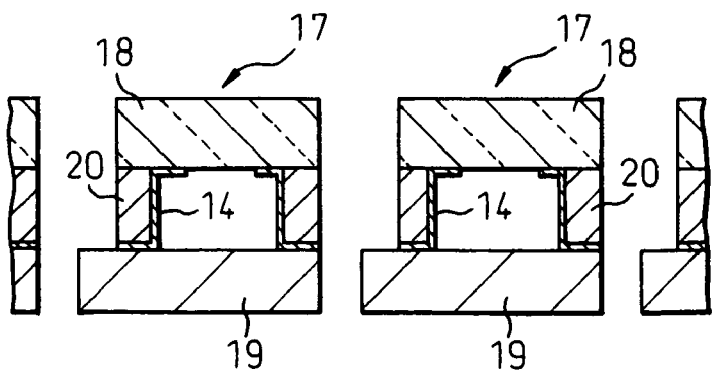

After the two wafers have been joined, the wafer 16, having elements formed thereon in advance, is cut together with the glass sheet 13 to individual pieces to obtain devices 17 as chips each having a light transmissive glass cover member 18 fixed thereto, as shown in FIG. 1F. In this device 17, the light transmissive glass cover 18 is fixed via the silicon junction member 20 to the body 19 of the device comprising the element.

Figure 2:
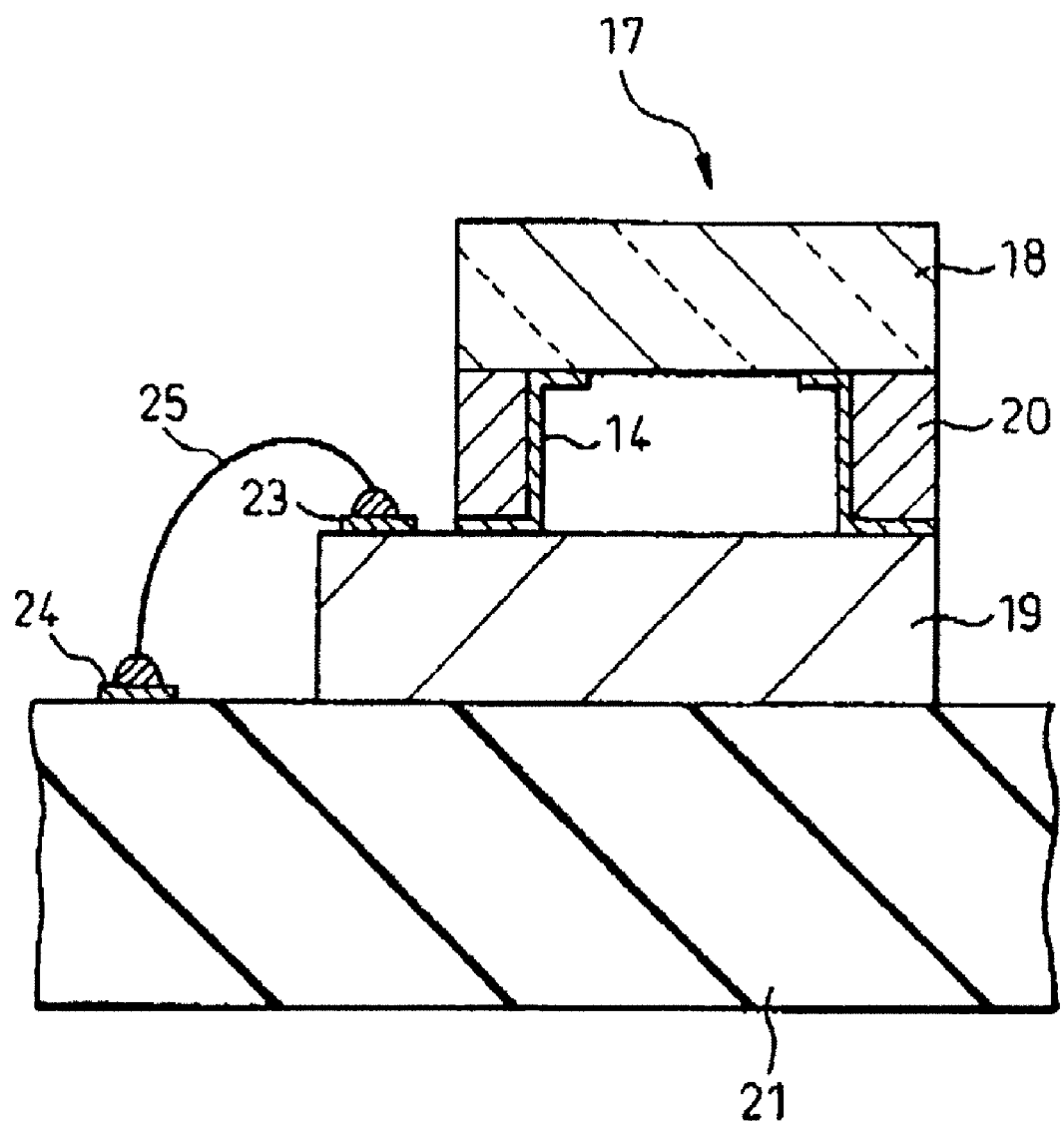
FIG. 2 shows an example of a device provided with a light transmissive cover according to the present invention mounted on a substrate.

As shown in FIG. 2, in the region seen at the left of the device 17 and not covered with the cover member 18, a pad 23 or the like is provided for mounting the device 17 on a substrate 21 by wire bonding to electrically connect the device 17 with a wire 25 to a pad 24 of the substrate 21. Depending upon a method for mounting the device on a substrate, such a region need not be provided in the device 17.

Next, a method of manufacturing a light transmissive cover in accordance with another embodiment of the present invention and a method of manufacturing a device provided with a light transmissive cover using the resultant cover will be described.

Figure 3A:
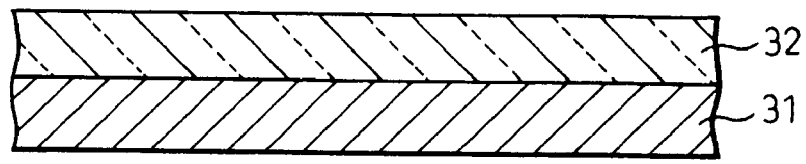
FIGS. 3A to 3C illustrate the manufacture of a light transmissive cover according to another embodiment of the present invention, and the manufacture of a device with a light transmissive cover using the resultant cover.
Figure 3B:
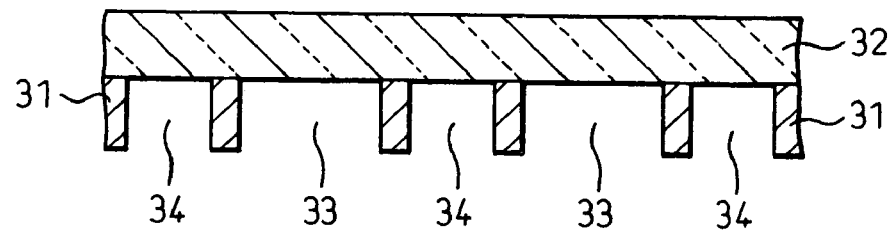
Figure 3C:
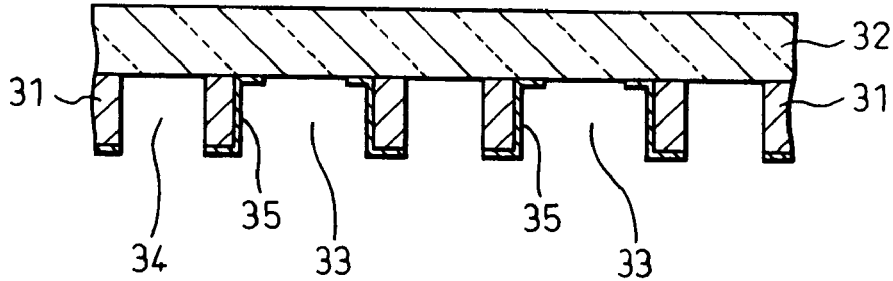

As shown in FIG. 3A, a silicon wafer 31 is joined to a glass sheet 32 to be integrated therewith. The joining may be performed using a method such as anodic bonding as in the previous embodiment. Then, the silicon wafer 31 is patterned to simultaneously form openings 33 in regions destined to cover devices later, and grooves 34 for later dicing, by a method such as machining as shown in FIG. 3B. Next, a light interrupting film 35 is formed by deposition and patterning of $CrO_2$ thin film or the like, as shown in FIG. 3C. Then, as has been described with reference to FIGS. 1E and 1F, the silicon wafer 31 having the openings 33 and the grooves 34 formed therein may be joined to a prescribed position of another wafer having elements formed thereon beforehand, and the wafer containing the elements may be cut together with the glass sheet 32 into individual pieces to obtain devices as chips each having a light transmissive glass cover member fixed thereto via a junction member.

Although, in the method as described above, a light interrupting film is formed using a $CrO_2$ thin film, another method can also be used to form a light interrupting film. For example, the dry etching method used for forming openings in a silicon wafer may also be used to form a light interrupting film. Next, the method of forming a light interrupting film by means of dry etching of a silicon wafer will be described.

When silicon is dry-etched under certain conditions, a vapor-like material of silicon compound is produced and deposits on the etched silicon surface, in the form of islands. Silicon cannot be etched at the locations where the silicon compound deposits and, thus, the silicon surface after dry etching is in a state of being covered with a large number of needle-shaped protrusions (like the ceiling of a limestone cave covered with a large number of stalactites). Light incident upon the etching surface in such a state is not reflected back, and the surface appears black to the naked eye. In the present invention, such an etched silicon surface may be formed and the resultant black surface may be utilized as a light interrupting film.

Figure 4A:
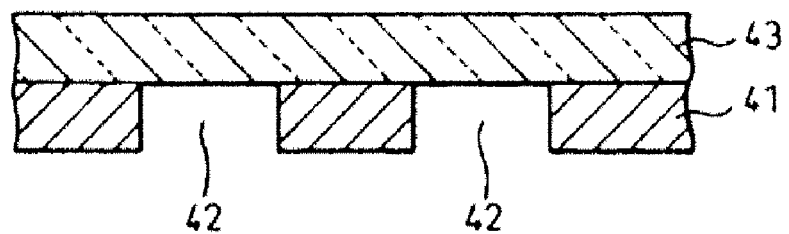
FIGS. 4A and 4B illustrate an alternative method of forming a light interrupting film.
Figure 4B:
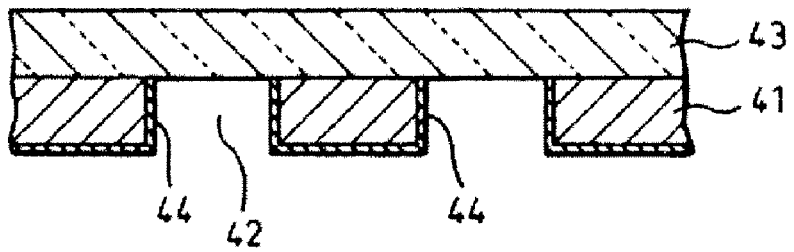
Figure 5:
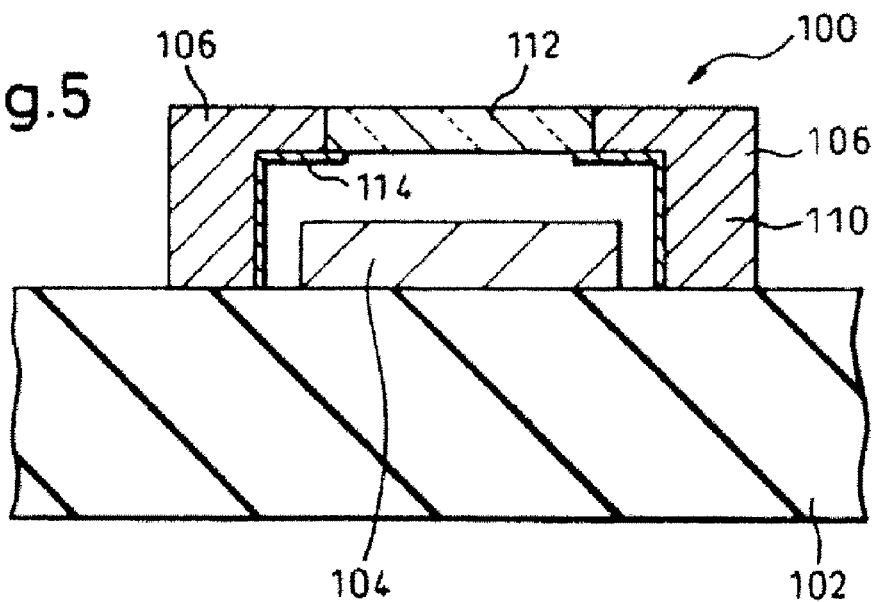
FIG. 5 illustrates a conventional device provided with a light transmissive cover.
Figure 6A:
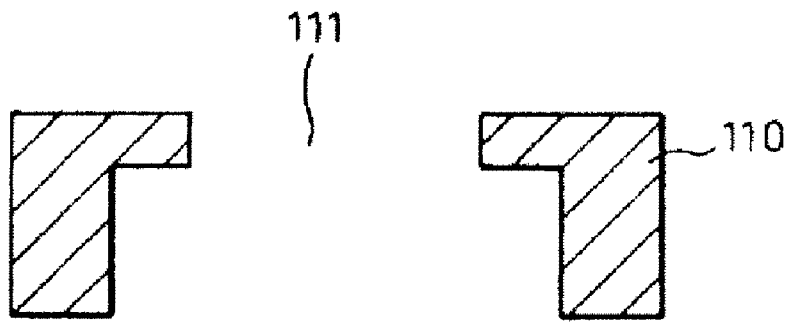
FIGS. 6A to 6D illustrate a conventional method of manufacturing a device provided with a light transmissive cover.
Figure 6B:
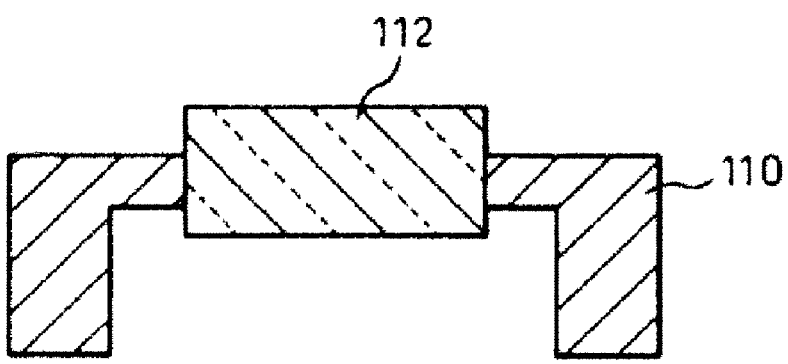
Figure 6C:
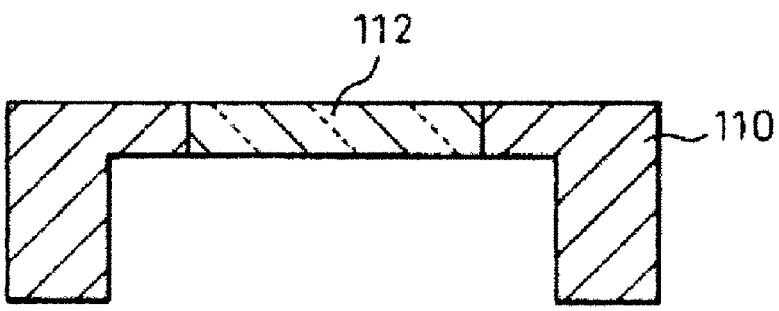
Figure 6D:
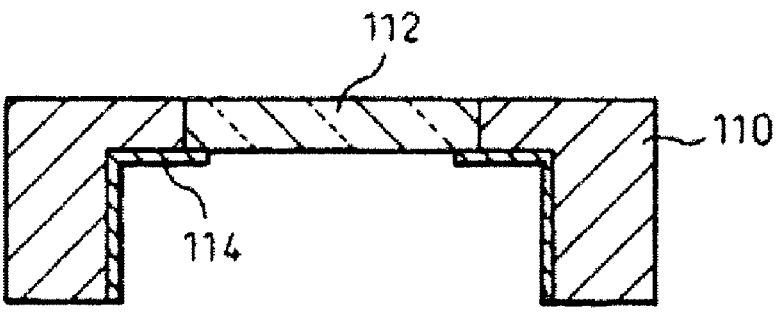

An example of light interrupting film formed by dry etching of silicon will be described with reference to FIGS. 4A to 4B. First, as shown in FIG. 4A, a silicon wafer 41 having openings 42 formed as has been described with reference to FIGS. 1A to 1B is joined to a glass sheet 43 to be integrated therewith. Then, the silicon wafer 41 is subjected to dry etching to form a light interrupting film 44 on the inner surface of the openings 42 as shown in FIG. 4B.

Dry etching in this case is performed using the Bosch process in which etching and deposition of silicon are alternately repeated. The Bosch process is a dry etching process developed by Bosch GmbH in Germany, and is generally used for deep etching of silicon. In this process, $SF_6$ is used as an etching gas and $C_4F_8$ is used as a gas for deposition. Thus, a supply of $SF_6$ at 700 sccm, 15 Pa, and for 7 seconds and a supply of $C_4F_8$ at 100 sccm, 5 Pa, and for 3 seconds are alternately repeated, and silicon is subjected to dry etching at the conditions of wafer temperature of $-10°$ C., source power of 2000 W, and bias power of 100 W. The sizes of needle-shaped protrusions formed etc. can be controlled by varying the etching conditions.

Then, as has been described before with reference to FIGS. 1D to 1F, grooves for later dicing are formed in the silicon wafer, and the wafer having the openings and grooves formed thereon is joined to a prescribed position of another wafer having elements formed thereon beforehand. Then, the wafer comprising the elements can be cut together with the glass sheet into individual pieces to obtain devices as chips each provided with the light transmissive cover.

Although, in the embodiments described above, as seen in FIG. 1F, the light transmissive film 14 is joined to the body of the device without removing part of the film that has been deposited on the end of the junction member 20, this part of the light interrupting film may be removed before the joining.

Although, in the foregoing description of the embodiments of the present invention, a glass sheet is used as a light transmissive material sheet, and a silicon wafer is used as a junction member material sheet, the present invention is not limited to these examples. Any sheet material other than a glass sheet may be used as a light transmissive material sheet as long as it has appropriate light transmissivity and can be integrated with a junction member material sheet to be processed in the integrated body. Likewise, any sheet material other than a silicon wafer may be used as a junction member material sheet as long as it can be integrated with a light transmissive material sheet and can be subjected to a process such as patterning by means of etching or the like.

The light transmissive cover according to the present invention can be applied to any device which uses a light transmissive member, including a digital mirror device.

The invention claimed is:

1. A method of manufacturing a light transmissive cover for a device, comprising:
   patterning a junction member material sheet to facilitate subsequent cutting to form a plurality of chips, wherein each chip comprises an individual light transmissive cover disposed adjacent to inner walls in the junction member material sheet, wherein the inner walls and the individual light transmissive cover form a device engaging aperture;
   joining the patterned junction member material sheet to a joining side of a light transmissive material sheet, such that each device engaging aperture formed in the junction member material sheet is covered with the light transmissive material sheet;
   forming dicing grooves in the junction member material sheet, after joining the patterned junction member material sheet to the light transmissive material sheet, between adjacent device engaging apertures and across an entire thickness of the junction member material sheet, such that each dicing groove exposes at its joining side aperture a surface of the joining side of the light transmissive material sheet;
   forming a light interrupting film on inner surfaces of the device engaging apertures of the junction member material sheet; and
   cutting, along the dicing grooves, the junction member material sheet and the light transmissive material sheet to form individual light transmissive covers.

2. A method according to claim 1, wherein said light transmissive material sheet is a glass sheet.

3. A method according to claim 1, wherein said junction member material sheet is a silicon wafer.

4. A method according to claim 3, wherein said light interrupting film is formed by dry etching of said silicon wafer.

5. The method according to claim 1, wherein the junction member material sheet is joined to the light transmissive material sheet by anodic bonding.

* * * * *